(12) United States Patent
Chen et al.

(10) Patent No.: US 11,903,175 B2
(45) Date of Patent: Feb. 13, 2024

(54) POWER CONVERTER WITH INTEGRATED MULTI-LAYER COOLING

(71) Applicant: MAGNA INTERNATIONAL INC., Aurora (CA)

(72) Inventors: Yang Chen, Kingston (CA); Wenbo Liu, Kingston (CA); Andrew Yurek, Kingston (CA); Bo Sheng, Kingston (CA); Xiang Zhou, Kingston (CA); Yan-Fei Liu, Kingston (CA); Lakshmi Varaha Iyer, Troy, MI (US); Gerd Schlager, Kefermarkt (AT); Michael Neudorfhofer, Sankt Valentin (AT); Wolfgang Baeck, Sankt Valentin (AT)

(73) Assignee: MAGNA INTERNATIONAL INC., Aurora (CA)

( * ) Notice: Subject to any disclaimer, the term of this patent is extended or adjusted under 35 U.S.C. 154(b) by 141 days.

(21) Appl. No.: 17/425,351

(22) PCT Filed: Jan. 24, 2020

(86) PCT No.: PCT/US2020/015034
§ 371 (c)(1),
(2) Date: Jul. 23, 2021

(87) PCT Pub. No.: WO2020/154648
PCT Pub. Date: Jul. 30, 2020

(65) Prior Publication Data
US 2022/0087079 A1    Mar. 17, 2022

Related U.S. Application Data

(60) Provisional application No. 62/796,392, filed on Jan. 24, 2019.

(51) Int. Cl.
*H05K 7/20* (2006.01)
*H02M 3/00* (2006.01)

(52) U.S. Cl.
CPC ........ *H05K 7/20927* (2013.01); *H02M 3/003* (2021.05); *H05K 7/20272* (2013.01); *H05K 7/20509* (2013.01); *H05K 7/20872* (2013.01)

(58) Field of Classification Search
None
See application file for complete search history.

(56) References Cited

U.S. PATENT DOCUMENTS

| | | |
|---|---|---|
| 5,495,889 A | 3/1996 | Dubelloy |
| 5,966,291 A | 10/1999 | Baumel et al. |

(Continued)

FOREIGN PATENT DOCUMENTS

| | | |
|---|---|---|
| CN | 105453256 A | 3/2016 |
| CN | 207910098 U | 9/2018 |

(Continued)

OTHER PUBLICATIONS

Extended European Search Report regarding EP App. No. 20745976.0; dated Dec. 13, 2021.

*Primary Examiner* — Courtney L Smith
(74) *Attorney, Agent, or Firm* — Dickinson Wright PLLC

(57) ABSTRACT

A power converter includes an integrated multi-layer cooling structure. The power converter includes a plurality of printed circuit boards (PCBs) stacked together in a generally vertical arrangement. A liquid cooling mechanism is attached to a lower-most PCB, and high loss circuitry components are attached to an opposite side of the lower-most PCB. Low loss circuitry components are attached to further PCBs. Magnetic components may be attached to the further PCBs. The high loss components are actively cooled by the liquid cooling mechanism and the low loss components and magnetic components are passively cooled. The liquid cooling mechanism may be a cold plate heatsink. The power converter may include intermediate PCBs disposed (Continued)

between the upper-most PCB and the lower-most PCB, with low loss circuitry components attached to the intermediate PCBs.

14 Claims, 10 Drawing Sheets

(56) References Cited

U.S. PATENT DOCUMENTS

| | | |
|---|---|---|
| 11,521,914 B2 * | 12/2022 | Wan ........................ H01L 23/473 |
| 2003/0067748 A1 | 4/2003 | Tamba et al. |
| 2005/0156204 A1 * | 7/2005 | Uno .......................... H01L 24/84 |
| | | 257/E25.031 |
| 2006/0109626 A1 * | 5/2006 | Harris .................... H05K 7/1092 |
| | | 361/695 |
| 2006/0181857 A1 * | 8/2006 | Belady .................... H05K 1/141 |
| | | 257/E23.099 |
| 2009/0218078 A1 * | 9/2009 | Brunschwiler ........... G06F 1/20 |
| | | 361/679.53 |
| 2017/0104419 A1 | 4/2017 | Zeng et al. |
| 2018/0102470 A1 * | 4/2018 | Das ......................... H01L 25/50 |

FOREIGN PATENT DOCUMENTS

| | | |
|---|---|---|
| EP | 0151546 A2 | 8/1985 |
| EP | 0841843 A1 | 5/1998 |
| EP | 2150098 A2 | 2/2010 |
| EP | 2911193 A1 | 8/2015 |
| GB | 2512378 A | 10/2014 |
| WO | 2018093195 A1 | 5/2018 |

* cited by examiner

Table 1. Summary of simulated and experimental thermal results.

| | Transformer | Lp | Lr | GaN | SR | Efficiency |
|---|---|---|---|---|---|---|
| Simulated (°C) (Liquid) | 102.1 | 58 | 55 | 51 (42.5 - 60.5) | 68.2 | 97.7% |
| Experimental (°C) (Liquid and Fan) | 93 | 57 | 54 | 48.6 | 76 | 96% |
| Difference (°C) | 9 | 1 | 1 | 3 | -8 | 1.7% |

FIG. 12

POWER CONVERTER WITH INTEGRATED MULTI-LAYER COOLING

CROSS-REFERENCE TO RELATED APPLICATIONS

This U.S. National Stage Patent Application claims the benefit of PCT International Patent Application Serial No. PCT/US2020/015034 filed Jan. 24, 2020 entitled "POWER CONVERTER WITH INTEGRATED MULTI-LAYER COOLING" which claims the benefit of and priority to U.S. Provisional Patent Application Ser. No. 62/796,392, filed on Jan. 24, 2019, titled "Integrated Multi-Layer Cooling (IMLC)," the entire disclosure of which is hereby incorporated by reference.

TECHNICAL FIELD

The present disclosure is related to printed circuit boards. More particularly, the present disclosure is related to cooling mechanisms for power converters having printed circuit boards.

BACKGROUND OF THE DISCLOSURE

Power converters today are tasked with delivering larger power at smaller sizes for a range of different output conditions. The primary limitation in meeting this demand is thermal dissipation. As the overall size of the converter and individual electronic components decrease, the loss of these components increases and the surface area available to dissipate heat decreases. The combination of increased loss and decreased surface area poses a difficult challenge for the thermal design of the converter.

Power converters use different cooling solutions to achieve the thermal requirements of the design. Typically, power converters consist of one printed circuit board (PCB) with electronic and magnetic components soldered to the top side of the board. These components are typically cooled on the top side using heatsinks, or on the bottom side through the PCB to a heatsink. Different innovations have been developed to improve this design and increase thermal dissipation from the device.

Prior solutions have focused on improving existing cooling methods to improve thermal performance of existing electronic devices. In one example, a coolant pump doubles as a heatsink for the cooling unit.

In another example, different copper cold plate heatsink technologies are implemented. In another example, thermal expansion is addressed to maintain the long-term lifespan of a liquid cooling loop.

Research has also focused on using different coolants to improve heatsinking. Research has either focused on improving the cooling or PCB design exclusively.

In view of the above, improvements may be made to the construction of PCBs and related cooling mechanisms in order to achieve efficient and optimized thermal performance while also reducing overall device volume.

SUMMARY

It is an object of the disclosure to provide a PCB structure with a low device volume.

It is an object of the disclosure to provide a cooling mechanism for a PCB structure that effectively cools the PCB.

It is a further object of the present disclosure to provide a PCB with integrated cooling mechanisms that improve cooling performance and reduce device volume.

The proposed Integrated Multi-Layer Cooling (IMLC) structure aims to improve on both cooling and PCB design to achieve optimal thermal performance while minimizing device volume.

In one aspect, a power converter is provided. The power converter includes: at least one printed circuit board (PCB) including a first PCB; a plurality of circuitry components mounted to the at least one PCB; and a liquid cooling mechanism mounted to the first PCB. The plurality of circuitry components includes high loss circuitry components and low loss circuitry components. The high loss circuitry components have higher losses relative to the low loss circuitry components. The high loss circuitry components are attached to the first PCB. The liquid cooling mechanism is operable to actively cool at least the high loss circuitry components mounted to the first PCB. The high loss circuitry components are mounted to an opposite side of the PCB relative to the liquid cooling mechanism.

In one aspect, the at least one PCB further includes a second PCB attached to the first PCB, wherein the second PCB is disposed vertically relative to the first PCB.

In one aspect, the low loss circuitry components are attached to the second PCB.

In one aspect, the power converter further includes a plurality of connector rods connecting the first PCB to the second PCB.

In one aspect, the connector rods are copper and electrically connect the first PCB to the second PCB.

In one aspect, the first PCB is a lower-most PCB and the second PCB is an upper-most PCB, the lower-most PCB disposed below the upper-most PCB, wherein the liquid cooling mechanism is attached to a bottom surface of the lower-most PCB and the high loss circuitry components are attached to an upper surface of the lower-most PCB.

In one aspect, the low loss circuitry components are attached to the upper-most PCB.

In one aspect, the power converter includes magnetic components attached to the upper-most PCB.

In one aspect, the magnetic components are attached to an upper surface of the upper-most PCB and the low loss circuitry components are attached to a lower surface of the upper-most PCB.

In one aspect, the low loss circuitry components are attached to both the upper and lower surfaces of the upper-most PCB.

In one aspect, the power converter includes at least one intermediate PCB disposed between upper-most PCB and the lower-most PCB.

In one aspect, the low loss circuitry components are attached to at least one of an upper or lower surface of the intermediate PCB, and a magnetic component is attached to an upper surface of the upper-most PCB.

In one aspect, the liquid cooling mechanism is a cold plate heatsink having an inlet and an outlet configured to circulate coolant therethrough and to transfer heat from the high loss circuitry components to the liquid coolant.

In another aspect, a method of cooling a power converter is provided. The method includes operating a power converter, where the power converter includes: a plurality of printed circuit boards (PCB) connected via a plurality of connector rods, the plurality of PCBs including a lower-most PCB and an upper-most PCB; a liquid cooling mechanism attached to the lower-most PCB; high loss circuitry components attached to the lower-most PCB; and low loss circuitry components attached to one of the plurality of printed circuit boards.

The method includes actively cooling the high loss-circuitry components via the liquid cooling mechanism and passively cooling the low-loss circuitry components.

In one aspect, the step of actively cooling the high-loss circuitry components includes circulating a coolant through the liquid cooling mechanism and transferring heat from the high loss circuitry components to the coolant.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 12 illustrates a table summary of experimental results.

DETAILED DESCRIPTION OF THE ENABLING EMBODIMENTS

Figure 1:
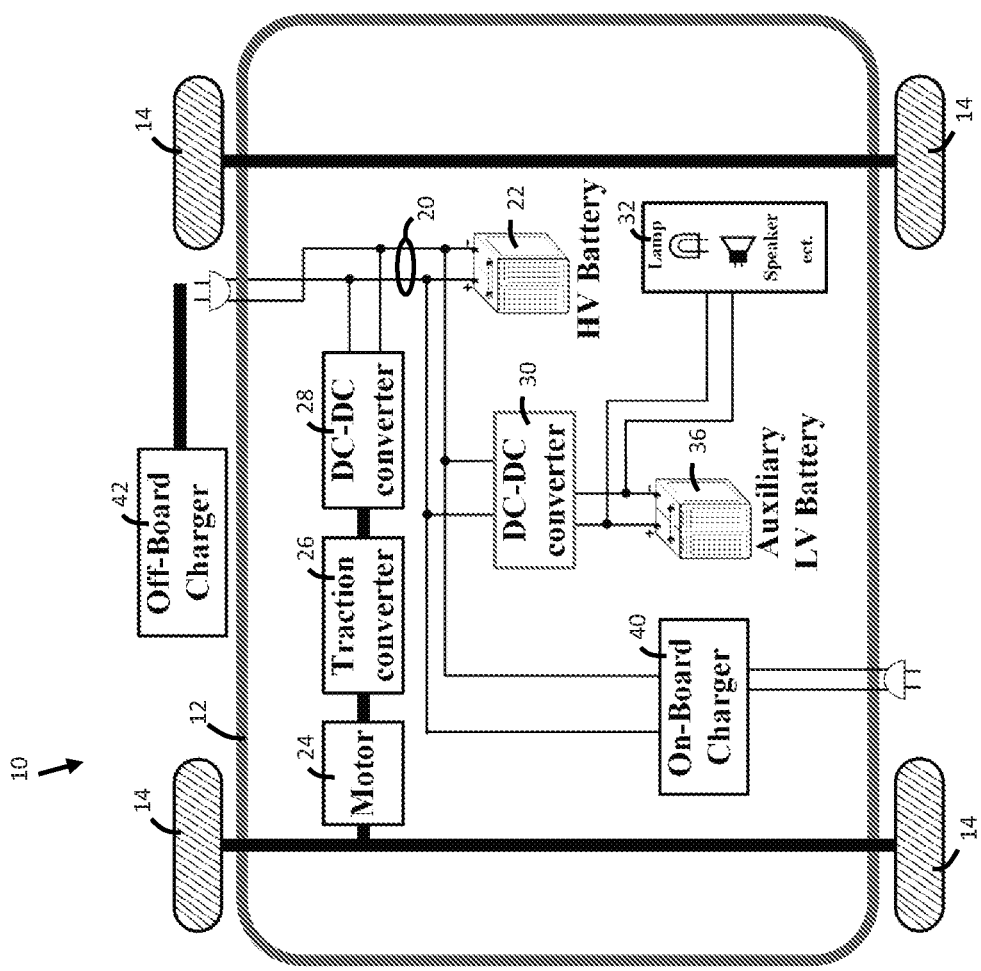
FIG. 1 is a schematic diagram of a power distribution system for a vehicle including a power converter.

FIG. 1 is a schematic diagram showing a power distribution system 10 of a motor vehicle 12 having a plurality of wheels 14. The power distribution system 10 includes a high-voltage (HV) bus 20 connected to a HV battery 22 for supplying power to a motor 24, which is configured to drive one or more of the wheels 14. The HV bus 20 may have a nominal voltage that is 250 VDC-430 VDC, although other voltages may be used. The motor 24 is supplied with power via a traction converter 26, such as a variable-frequency alternating current (AC) drive, and a high-voltage DC-DC converter 28. The high-voltage DC-DC converter (HDC) 28 supplies the traction converter 26 with filtered and/or regulated DC power having a voltage that may be greater than, less than, or equal to the DC voltage of the HV bus 20. A low-voltage DC-DC converter (LDC) 30 is connected to the HV bus 20 and is configured to supply low-voltage (LV) power to one or more LV loads 32 via a LV bus 34. The LDC 30 may be rated for 1-3 kW, although the power rating may be higher or lower. The LV loads 32 may include, for example, lighting devices, audio devices, etc. The LDC 30 may be configured to supply the low-voltage loads 32 with DC power having a voltage of, for example, 9-16 VDC, although other voltages may be used. An auxiliary LV battery 36 is connected to the LV bus 34. The auxiliary LV battery 36 may be a lead-acid battery, such as those used in conventional vehicle power systems. The auxiliary LV battery 36 may supply the LV loads 32 with power when the LDC 30 is unavailable. Alternatively or additionally, the auxiliary LV battery 36 may provide supplemental power to the LV loads 32 in excess of the output of the LDC 30. For example, the auxiliary LV battery 36 may supply a large inrush current to a starter motor that exceeds the output of the LDC 30. The auxiliary LV battery 36 may stabilize and/or regulate the voltage on the LV bus 34. An onboard charger 40 and/or an off-board charger 42 supply HV power to the HV bus 20 for charging the HV battery 22.

The HDC 28 and the LDC 30 may be generally referred to herein as a power converter 100. The power converter 100 may include at least one PCB 102. The power converter 100 and PCB 102 may be a thermomechanical PCB design including an integrated multi-layer cooling (IMLC) structure 104 to achieve smaller package size while maintaining thermal performance.

The converter 100, PCB 102, and IMLC structure 104 may include various aspects for improving cooling performance and reducing overall volume. In one aspect, multiple PCBs 102 may be vertically stacked to use three-dimensional space more efficiently, and may be referred to as PCB 102 layers.

In another aspect, the converter 100 may include multiple circuitry components 106 attached to the PCB 102. These components 106 may also be considered the payload of the converter 100 in which signals and power are received and processed and outputted for further use with the power distribution system 10. Various types of components 106 may be mounted to the PCB 102, such that various components 106 may have different sizes, shapes, footprints, or the like, and may likewise have different thermal generation aspects and losses and requiring different degrees of thermal dissipation.

In one aspect, the components 106 may be sorted or otherwise distributed in a predetermined manner, such as being sorted by a degree of loss for improved cooling.

In another aspect, the converter 100 may include an integrating liquid cooling mechanism 108 for optimal thermal dissipation.

For purposes of discussion, a 1.3 kW Inductor-Inductor-Capacitor (LLC) power converter may be used to illustrate and test the structure of the convertor 100 and IMLC design structure 104. Finite Element Analysis (FEA) thermal analysis may be conducted for a 1.3 kW single-layer LLC power converter with integrated liquid cooling. An experimental prototype may be developed for the same design under air and liquid cooling conditions. Experimental results show a 46° C. temperature decline in a synchronous rectifier (SR) when using cold plate liquid cooling. Simulated thermal results of the liquid-cooled tests agree with experimental results. A new two-layer IMLC prototype may be constructed that achieves 31% greater power density at 3.12 kW/L with heatsink design unchanged. Thermal results are therefore expected to remain unchanged from the single-layer design.

As described above, and described in further detail below, the power converter 100 includes the Integrated Multi-layer Cooling (IMLC) structure 104. As described herein, IMLC structure 104 is used to improve thermal dissipation while reducing converter size. The objective of IMLC structure 104 is to use package volume more efficiently to reduce volume while maintaining thermal performance. IMLC structure 104 focusses on multiple design principles to achieve these objectives, mentioned previously above.

Figure 2:
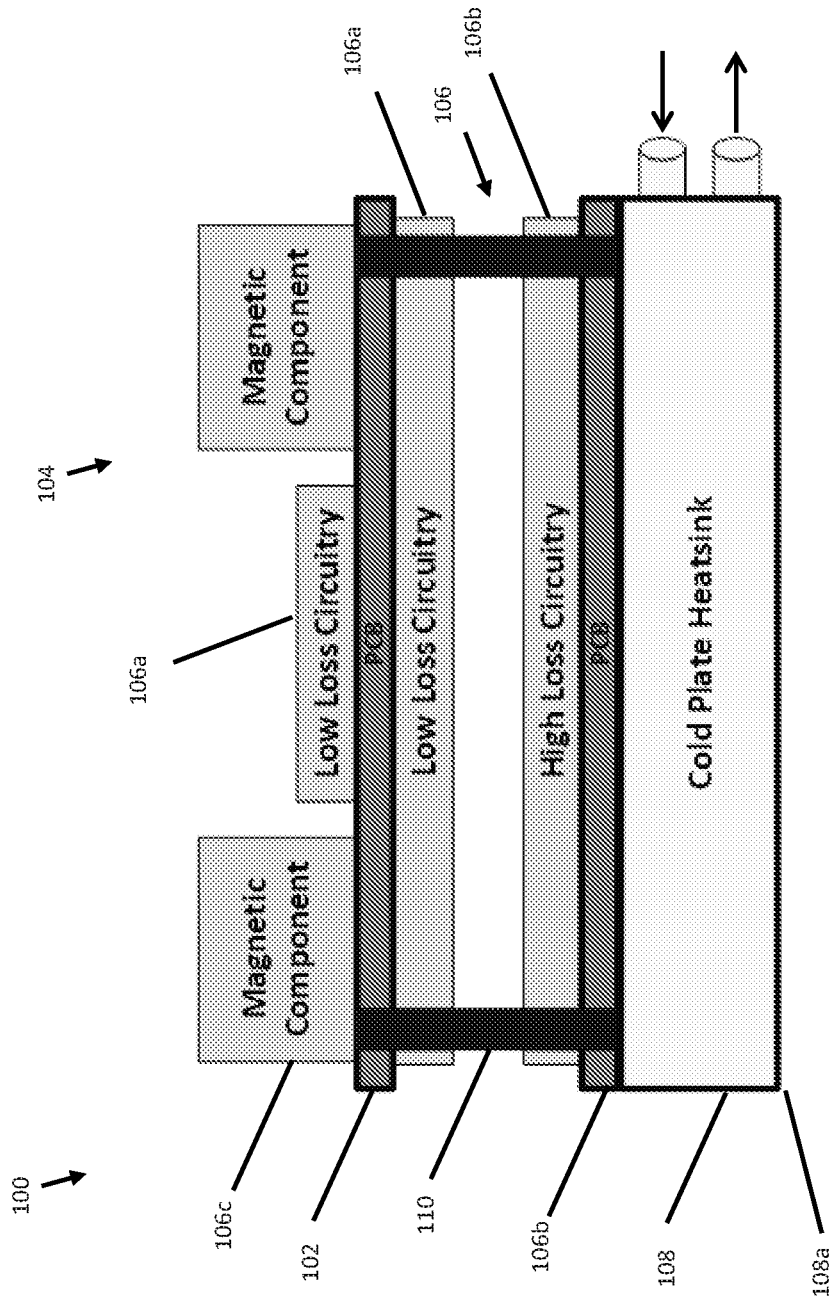
FIG. 2 is a schematic illustration of an integrated multi-layer converter (IMLC) structure having two printed circuit board (PCB) layers.

In one aspect, shown in FIG. 2, IMLC structure 104 uses two or more PCB's 102 connected, in one aspect, vertically through copper connections to make use of three-dimensional space. Second, IMLC structure 104 sorts components 106 by heat generation and distributes components 106 according to these properties. Finally, IMLC structure 104 incorporates liquid cooling through the integrated cooling mechanism 108, which may in the form of a cold plate heatsink 108a attached to the bottom-side of the bottom-most PCB 102.

In one aspect, multiple PCB 102 layers are used in the IMLC structure 104 to achieve more efficient use of three-dimensional space. For example, the bottom-most PCB 102 layer may be referred to as a first PCB, and the upper-most PCB 102 layer may be referred to as a second PCB, with additional PCB 102 layers disposed between them referred to as intermediate PCBs 102. The IMLC structure 104 allows the length and width of the converter 100 to be reduced significantly while at the same time increasing the overall surface area of the PCBs 102 available for mounting the various components 106. The increase in height of the converter 100 is relatively smaller than the decrease in length and width, and therefore the volume of the converter 100 is decreased overall.

FIG. 2 illustrates one example of the IMLC structure 104 using a two-layer PCB 102 construction. Put another way, two PCBs 102 may be assembled together in a generally vertical arrangement. It will be appreciated that the reference to "vertical" and "horizontal" is for illustrative purposes and in reference to the figures, and that the converter 100 may operate in other orientations relative to the illustrated orientation of the figures. For example, the converter 100 may be positioned on its side, upside-down, at an angle, or the like relative to the orientation illustrated in the figures.

The converter 100 illustrated in FIG. 2 illustrates each of the above-described approaches to reducing volume while maintaining thermal performance. As shown, two PCBs 102 are positioned vertically relative to each other. A pair of copper connector rods 110 extend in a generally vertical direction in FIG. 2, connecting the two PCBs 102. While the connector rods 110 are described as being copper, it will be appreciated that other materials may be used. Copper may be preferable in some aspects, with the copper material operable to conduct heat from one PCB 102 to the other 102, thereby improving the heat transfer therebetween. However, it will be appreciated that in some aspects the connector rods 110 may be made of a non-conductive material or a material with lower conductivity. As shown, two connector rods 110 are illustrated, but it will be appreciated that the specific size and shape of the convertor 100 may result in additional rods 110 being used. As shown in FIG. 2, additional rods 110 may be provided "behind" the illustrated rods 110. For example, in a box-like structure of the converter 100, four rods 110 may be provided at each corner. The connector rods 110 therefore physically and electrically connect the multiple PCB 102 layers as the diagram highlights (two layers as shown FIG. 2).

Additionally, as referenced above, the various components 106 that are mounted to the converter 100, and in particular the components 106 that are attached to the PCBs 102, may be sorted according to their thermal properties. With reference to FIG. 2, the components 106 may include Low Loss Circuity components 106a and High Loss Circuity components 106b. The components 106 may further includes magnetic components 106c. In one aspect, for high loss components 106b, it may be desirable to use active cooling to account for the larger amount of heat to be dissipated. In another aspect, low loss components 106a and magnetic components 106c may be cooled by passive cooling.

In one aspect, passively cooled devices such as the low loss circuitry components 106a and magnetic components 106c may be placed on the top-layer PCB 102. In one aspect, high loss components 106b may have a "direct" connection to the cold plate heatsink 108a, which may be attached to the bottom-layer PCB 102. More particularly, the cold plate heatsink 108a may be disposed on a bottom surface of the bottom-layer PCB 102, and the high loss circuitry components 106b may be disposed on the top surface of the bottom-layer PCB 102. In this aspect, the "direct" connection to the cold plate heatsink 108a includes the construction in which the high loss circuitry components 106b are mounted to one surface of the PCB 102, and the cold plate heatsink 108a is mounted to the opposite side of the same PCB 102. It will be appreciated that this reference to a direct connection to the cold plate heatsink 108a includes the construction with the PCB 102 disposed between the components 106b and the heatsink 108a.

FIG. 2 therefore illustrates on example of the aspects discussed above. Additional modifications of the connector 100 shown in FIG. 2 may be made to tailor the heat dissipation of the connector 100. For example, depending on the quantity of high loss components 106b, low loss components 106a may be attached to the bottom-layer PCB 102 in addition to the high loss components 106b. In this example, the low loss components 106a may benefit from the active cooling provided by the cold plate heatsink 108a. Similarly, the magnetic components may also be attached to the bottom layer PCB 102 and be actively cooled by the cold plate heatsink 108a.

Figure 3:
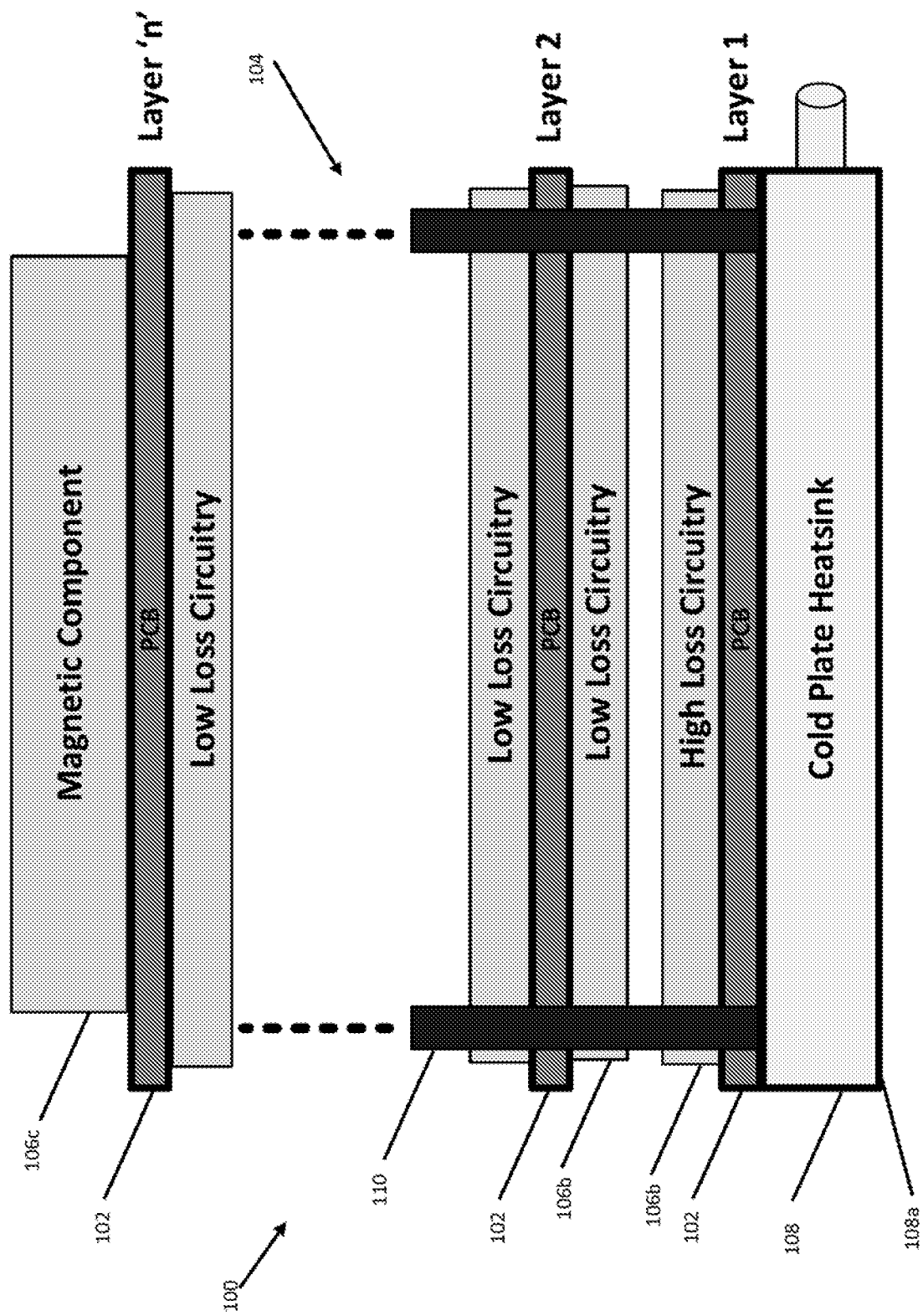
FIG. 3 is a schematic illustration of another aspect of an IMLC structure having more than two PCB layers.

With reference to FIG. 3, the connector 100 may include additional PCBs 102 beyond the two PCBs 102 illustrated in FIG. 2. FIG. 3 illustrates the IMLC structure 104 expanded to accommodate additional intermediate PCB 102 layers as desired by the designer. Any number of PCB 102 layers can be achieved based on the design requirements in order to accommodate the desired number of overall components 106.

As described above, the high loss components 106b are preferably disposed on the bottom PCB layer 102, which may also be referred to as the bottom-most PCB 102 layer. The cold plate heatsink 108a includes structure that projects from the PCB 102 to which it is mounted, so it may be desirable for the cold plate heatsink 108a to be disposed on the bottom-most layer to allow for the structure of the heatsink 108a to extend from the PCB 102 as much as necessary without interfering with other components of the connector 100.

Similarly, in some aspects, it may be desirable to dispose the magnetic components 106c on an upper-most layer of the PCB 102 layers, as shown in FIG. 3. Put another way, the magnetic components 106c may be disposed on the PCB 102 layer furthest from the cold plate heatsink 108a.

As shown in FIG. 3, the high loss components 106c are disposed on the bottom-most PCB 102 layer, and the magnetic components 106c are disposed on the upper surface of the upper-most PCB 102 layer. The low loss components 106a are disposed on intermediate PCB 102 layers, and may be located between the magnetic components 106c and the high loss components 106b. The low loss components 106a may also be disposed on the bottom surface of the upper-most PCB.

The multiple PCB 102 layers illustrated in FIG. 3 may be connected to each other via common connector rods 110, such that each connector rod 110 is attached to each of the PCB 102 layers. In another approach, the connector rods 110 may connect a portion of the PCB layers 102 together, with additional connector rods 110 connecting other layers, such as in a chain-type connection. For example, one of the connector rods 110 may connect the bottom two PCBs 102, which may be referred to as first and second PCB 102 layers, and another connection rod 110 may connect the second PCB 102 layer to a third PCB 102 layer. Accordingly, the third PCB 102 layer may be electrically connected to the bottom/first PCB layer via the second PCB 102 layer. It will be appreciated that this connection arrangement may be modified to connect various numbers of PCBs 102 via the connector rods 110.

In one aspect, the high loss components 106c may not necessarily be components that fall within a predetermined loss range. Rather, the high loss components 106c may be a subset of the overall collection of components 106 that have the highest losses within the overall collection of the components 106. In one aspect, each of the components 106 mounted on the first PCB 102 layer (or bottom-most PCB 102 layer) may have a greater or equal amount of thermal losses relative to the components 106 of the other PCB 102 layers.

In one aspect, the components 106 may be arranged on the connector 100 such that the components 106 with the higher losses are arranged on the closest PCB 102 layer relative to the cold plate heatsink 108a, and components with the lower losses are arranged on the furthest PCB 102 layer from the heatsink 108a, with the losses of the components 106 mounted throughout the connector 100 generally decreasing manner in relation to the positions of the PCB 102 layers relative to the cold plate heatsink 108a. For example, the components 106 on the first PCB layer 106 may have higher losses than the components 106 on the second PCB 102 layer, and the components 106 on the second PCB 102 layer may have higher losses than the components 106 on the third PCB 102 layer.

In another aspect, the components 106 on each PCB 102 layer that is not the bottom-most layer may be arranged on any of the upper layers, such that the highest loss components 106 are mounted to the bottom PCB 102 layer, but components on the third layer may have high losses than components on the second layer. It is desirable to have the higher loss components 106b disposed on the bottom-most PCB 102 layer due to this layer having the cold plate heatsink 108a disposed on the bottom surface thereof, thereby providing active cooling to the components with the highest losses and the higher need for heat transfer therefrom. Components not falling within the subset of high loss components 106 may be arranged on the other PCB 102 layers and undergo passive cooling, and therefore it may be less beneficial to sort or arrange the remaining components 106 that are not directly actively cooled.

It will be appreciated that the above described arrangements in which the highest loss components 106 are arranged on the bottom PCB 102 layer is preferable such that direct connection to the active cooling is provided by the heatsink 108a. However, higher loss components 106 may still be mounted to PCB 102 layers other than the bottom most layer and the connector 100 may still provide benefits overall. For example, for space reasons, it may be desirable for a particular component to be mounted on one of the upper layers, and a lower loss component 106 may be mounted to the bottom PCB 102 layer. The components 106 mounted to the bottom PCB 102 layer may still receive active cooling via the heatsink 108a.

Thus, as described above, the components 106 of the IMLC structure 104 may be sorted and distributed based on heat generation and component type. Magnetic components may only require passive air cooling due to their large core surface area and comparatively small PCB 102 footprint. Similarly, low loss surface mount circuitry may only require passive air cooling. Therefore, these components 106 may be placed on the upper PCB layers of the IMLC structure 104. High loss surface mount components 106 may require active liquid cooling to transfer heat away from the small package. In the IMLC structure 104, these components are placed on the top side of the bottom-most PCB 102 layer. The distribution of components 106 allows passive cooling of appropriate components 106 and active liquid cooling of high loss components 106.

The IMLC structure 104 incorporates active liquid cooling through cold plate heatsinks 108a attached to the bottom side of the bottom most PCB 102 layer. The bottom side surface may be exclusively reserved for the heatsink 108a to maximize available heat transfer. However, as described above, it may be desirable in some cases to depart from this arrangement for packaging or assembly reasons.

Figure 4:
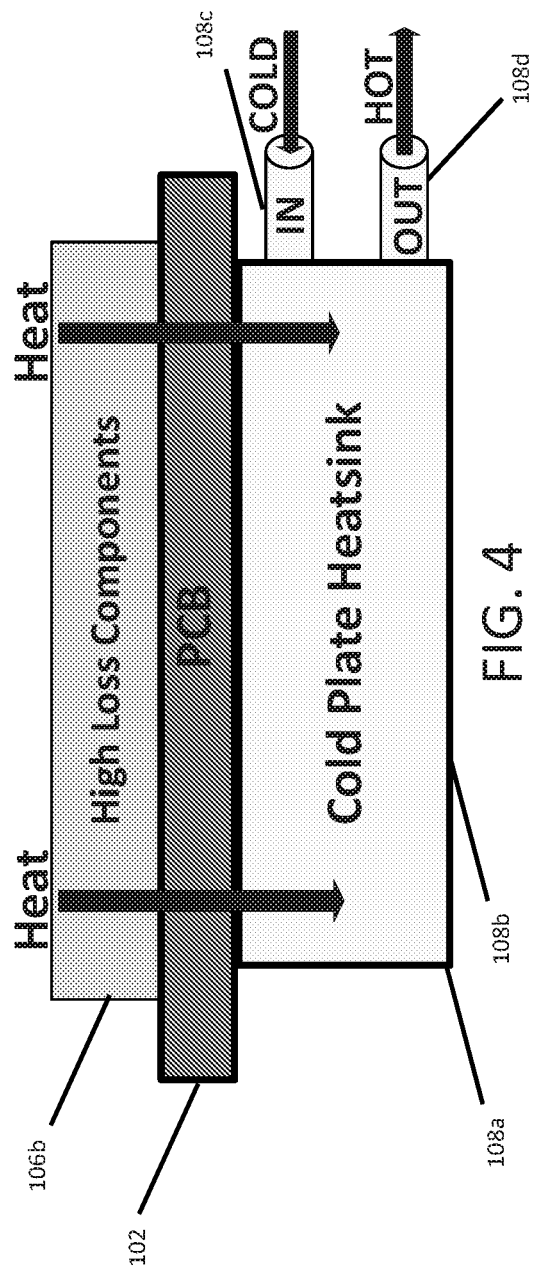
FIG. 4 is a schematic illustration of active cooling via heat transfer from high loss circuitry components mounted to a bottom PCB layer to a cold plate heatsink.

FIG. 4 illustrates the cold plate heatsink 108a connection to the bottom side of the bottom-layer PCB 102. FIG. 4 illustrates a direction of heat flow from the high loss circuitry 106b on the top side of the bottom-most PCB 102 through to the cold plate heatsink 108a to the liquid coolant flowing therethrough. It will be appreciated that various other types of heatsinks may also be used, including other active heatsinks as well as other passive heatsinks. Preferably, an active heatsink such as the cold plate heatsink 108a shown herein is used.

As illustrated, the cold plate heatsink 108a may include a housing 108b, an inlet 108c, and an outlet 108d. In one aspect, coolant may flow into the inlet 108c and may thereafter be circulated through the housing 108b. Heat from the high loss components 106b may transfer from the components 106 to the coolant. The coolant enters the heatsink 108a at a temperature lower than the high loss components 106, such that heat transfer will occur, with the heat moving from the high loss components 106 to the heatsink 108a. Accordingly, the temperature of the high loss components 106b will decrease, and the temperature of the coolant will increase. The coolant circulates through the heatsink 108a and will thereafter exit from the heatsink 108a at a higher temperature. The coolant can thereafter be cycled through additional cooling system components that will reduce the temperature of the coolant prior to the coolant re-entering the heatsink 108a. Other active cooling systems may also be used.

While the above-described convertor 100 has been described as having multiple PCB layers 102, it will be appreciated that the active cooling of the cold plate heatsink 108a can provide benefits to single PCB 102 layer arrangements, for example for a converter 100 that includes a limited quantity of components such that only a single PCB 102 layer is used.

The above-described connector 100 may be modeled and tested to determine the desired layout of components and to improve the efficiency of the connector 100. In one testing aspect, thermal simulation and analysis of the IMLC structure 104 has been performed. FEA thermal analysis has been used to simulate the thermal performance of the IMLC structure 104. The cold plate heatsink 108a is fixed at a constant temperature of 22° C. to simulate the constant temperature due to the heatsinking of the cold plate. In one example, the power converter selected for the simulation is a 1.3 kW LLC resonant converter. Two PCB 102 layers are used in this example IMLC structure 104, however because all heat generating components 106 are fixed to the bottom PCB 102 layer in this experiment, the top PCB 102 does not play a role in heat generation. Therefore, a one-layer thermal simulation of the IMLC structure 104 is used for simplicity. The results of the thermal simulation are illustrated in FIG. 5.

Figure 5:
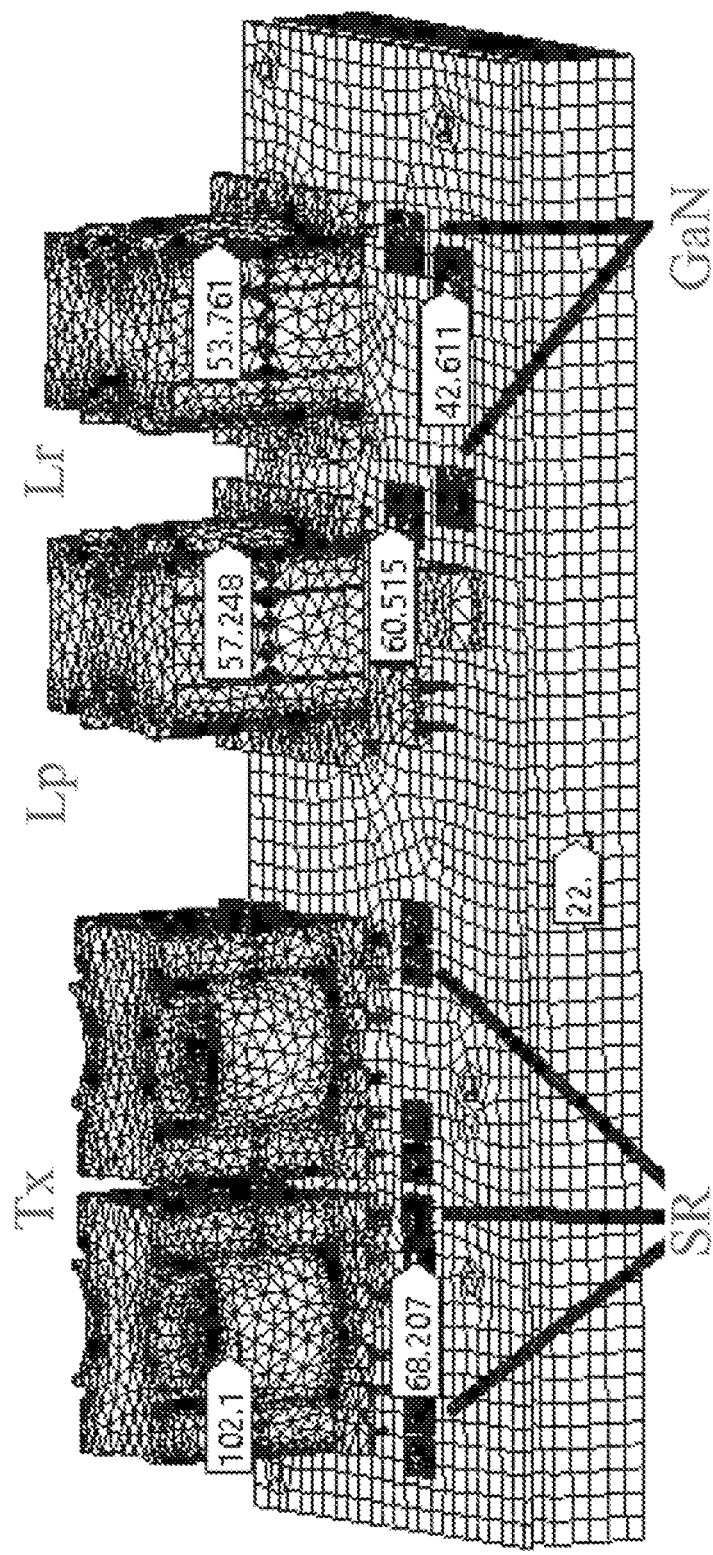
FIG. 5 illustrates simulation results for cooling a PCB.

The results of FIG. 5 show the temperatures of the transformers (Tx), series inductor ($L_r$), parallel inductor ($L_p$), primary side rectifier Gallium Nitride (GaN) switches (GaN), and synchronous rectifiers (SR) of the LLC converter.

In additional to simulation, experimental testing may also be performed on the IMLC structure 104 to detect actual temperatures for comparison with the FEA. In one aspect, thermal testing may be conducted on a single-layer 1.3 kW LLC power converter using cold plate heatsinking. This experimental design provides a good evaluation of the heatsinking ability of the IMLC 104 design because the cold plate 108a and high loss components 106 are still connected in the same way as the multiple-layer IMLC structure. With a single PCB 102 layer design, the volume of the converter 100 may be larger, however, as the dimensions of the single PCB 102 layer must be larger to accommodate all components. Therefore, the converter 100 volume will be larger, but thermal performance should be similar.

Figure 6:
FIG. 6 illustrates an experimental setup for verifying the simulation results.

The liquid cooling components 108 may include computer liquid cooling components. The liquid cooling loop may consist of a pump, reservoir, radiator with fans, a cold plate heatsink 108a, and tubing. FIG. 6 shows a single-layer PCB 102 prototype with liquid and fan cooling.

Figure 7:
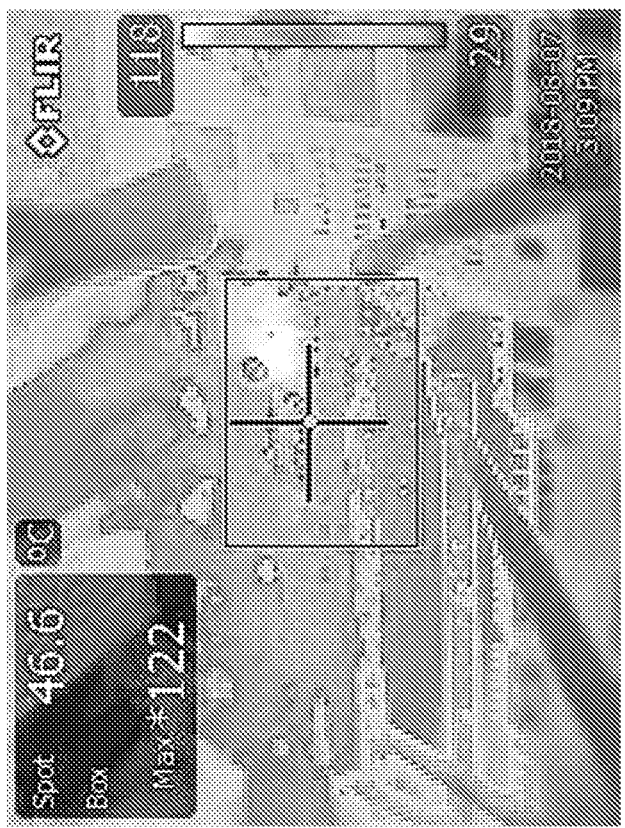
FIG. 7 illustrates experimental results of a temperature of the PCB without active liquid cooling.

Initially, experimentation is conducted on a single-layer 1.3 kW LLC resonant converter without liquid cooling. Therefore, the only cooling is through fan cooling. The temperature of the SR at 1.3 kW, $400V_{in}$, $14V_{out}$, and 95 A load is shown in FIG. 7.

Figure 8:
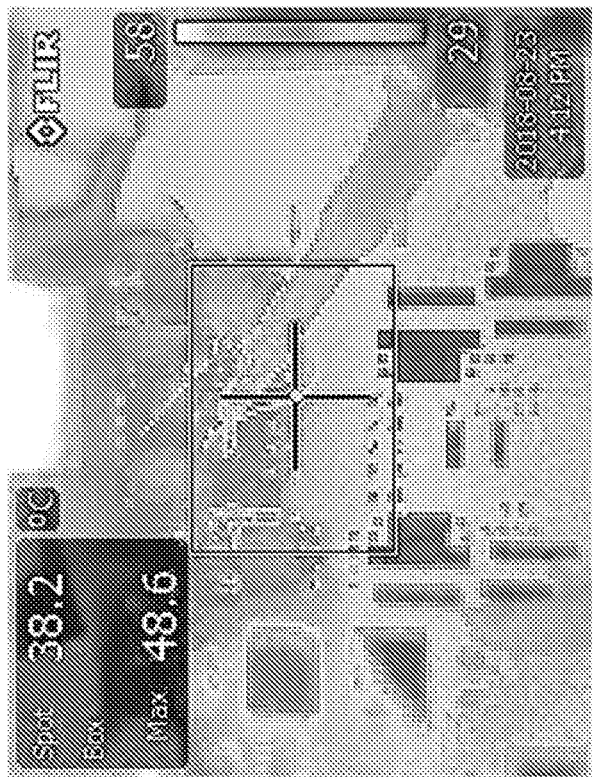
FIGS. 8-10 illustrate experimental results of temperatures of the PCB with active liquid cooling.
Figure 10:
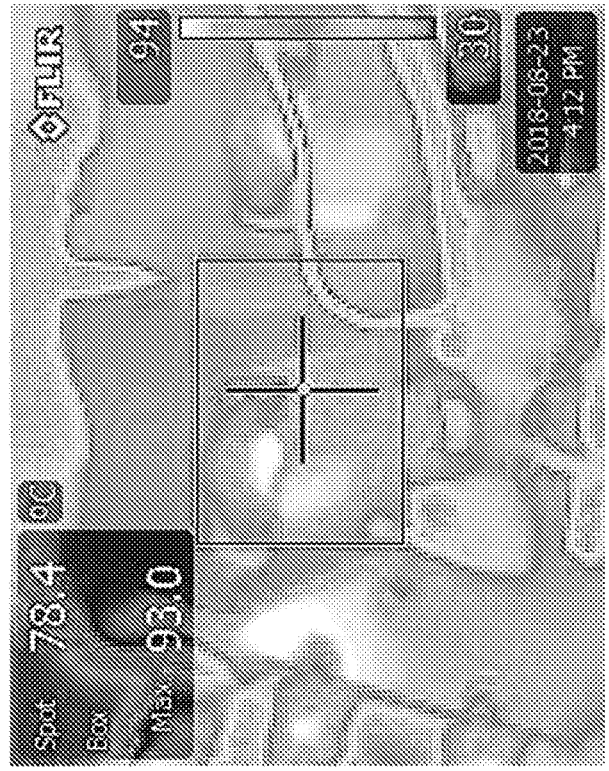
Figure 9:
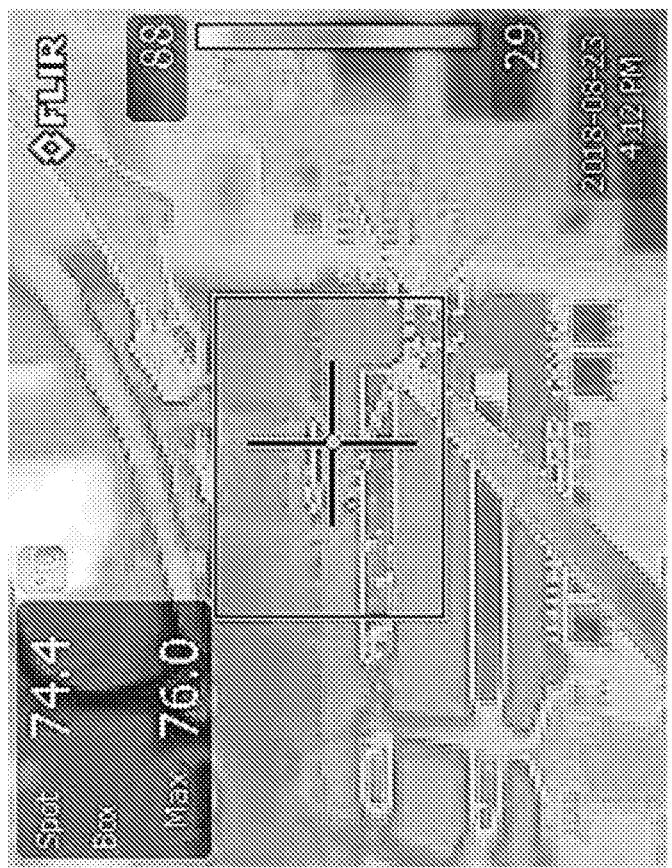

The next experiment uses cold plate liquid and fan cooling under the same conditions. The setup for this experiment is shown in FIG. 6. The thermal testing results are shown in FIGS. 8-10. FIG. 8 illustrates the GaN switch temperature. FIG. 9 illustrates the SR temperature. FIG. 10 illustrates the Transformer temperature. FIGS. 8-10 illustrate thermal images of the 1.3 kW LLC power converter with liquid and fan cooling at $400V_{in}$, $14V_{out}$, 95 A load.

Accordingly, the results of the thermal testing show that active liquid cooling reduces the SR temperature by 46° C. Therefore, the liquid cooling 108a of the IMLC structure 104 improves thermal performance of the package. The actual liquid-cooled results show that the experimental results agree with the simulation. A summary of the key temperatures and efficiencies is shown in Table 1 of FIG. 12.

The experimental liquid-cooled temperatures are generally lower than the simulation due to the addition of fan cooling for experimental tests. This is true for the magnetics 106c which are cooled exclusively by the air, particularly in the temperature difference of the transformers.

Figure 11:
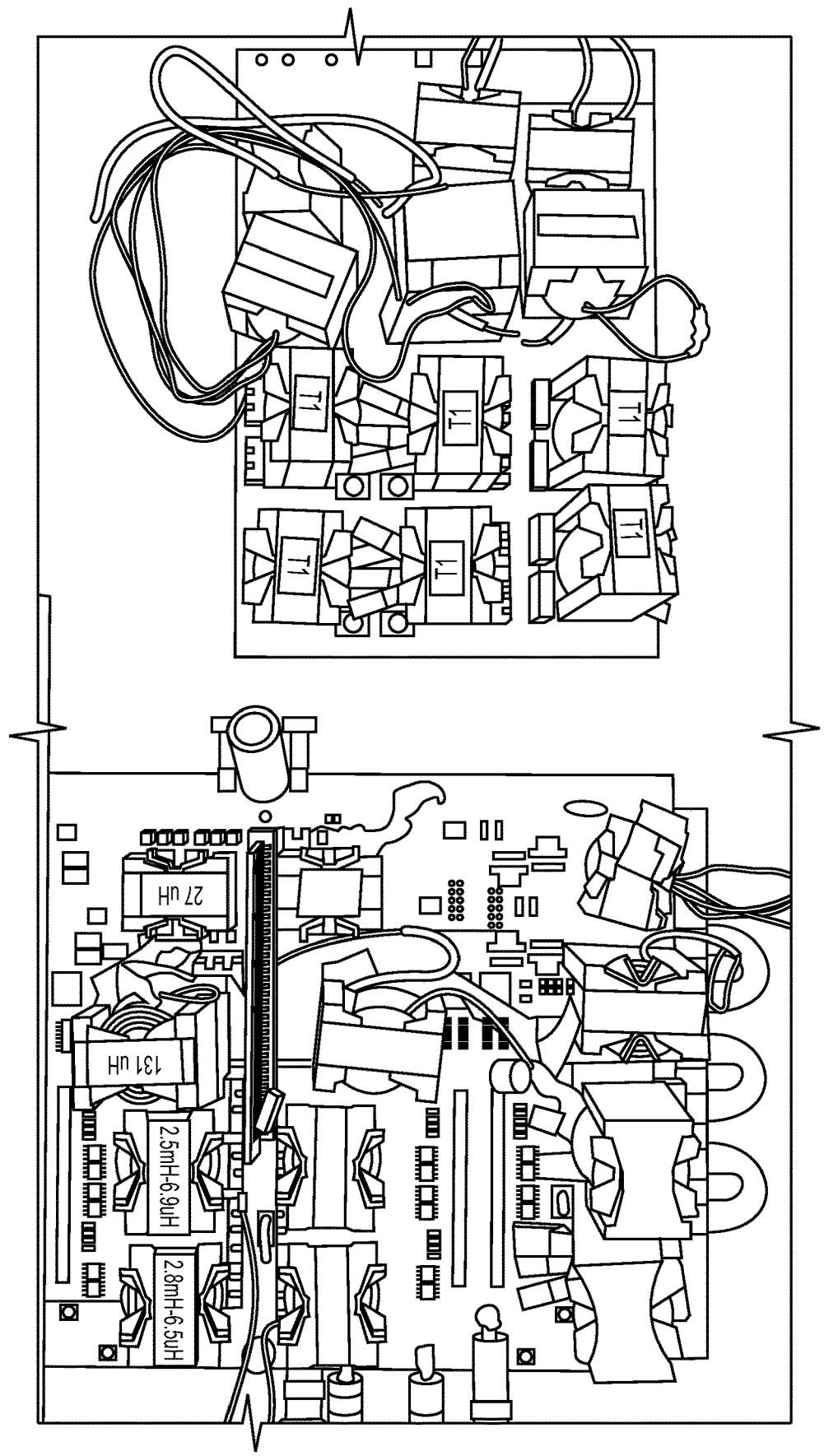
FIG. 11 illustrates a comparison between a single-layer PCB and a two-layer PCB structure.

The power density of the example IMLC 104 is 3.12 kW/L, compared to 2.38 kW/L for the single-layer LLC resonant converter with liquid cooling. Therefore, IMLC improves the total package power density by 31% compared to the single layer design. The surface area, component sizes, and heatsink construction are unchanged from the single to two-layer design, therefore thermal performance is expected to remain unchanged. FIG. 11 shows the single-layer design (left) and the two-layer IMLC 104 design (right) of the same power converter. As shown, the overall size of the converter 100 is greatly reduced in the two-layer IMLC structure relative to the single layer design with liquid cooling.

Thus, a new integrated multi-layer cooling (IMLC) structure 104 is provided for power converters 100 based on multiple PCB 102 layers and integrated liquid cooled heatsinking 108. The IMLC structure 104 improves package volume without sacrificing thermal performance based on three design principles: multiple vertically stacked PCB's 102 to use three-dimensional space more efficiently, component 106 sorting by loss for improved cooling, and integrating liquid cooling through a bottom mounted cold plate 108 for thermal dissipation. FEA thermal modelling is conducted using a 1.3 kW LLC power converter with integrated cold plate liquid cooling. Experimental testing on a single-layer 1.3 kW LLC converter with integrated liquid cooling verifies the heatsinking abilities of the IMLC structure. Integrated liquid-cooling reduces synchronous rectifier (SR) temperatures by 46° C. in experimental results. A two-layer IMLC LLC power converter has been designed and achieves 31% greater power density at 3.12 kW/L compared to the tested single layer design. Thermal performance is expected to remain unchanged for this IMLC design due to unchanged heatsink construction.

Obviously, many modifications and variations of the present invention are possible in light of the above teachings and may be practiced otherwise than as specifically described while within the scope of the appended claims. These antecedent recitations should be interpreted to cover any combination in which the inventive novelty exercises its utility.

What is claimed is:

1. A power converter comprising:
   a first printed circuit board (PCB) and a second PCB attached to the first PCB, wherein the second PCB is disposed vertically relative to the first PCB;
   a liquid cooling mechanism mounted to the first PCB;
   a plurality of circuitry components including high-loss circuitry components and low-loss circuitry components, wherein the high-loss circuitry components have higher losses relative to the low-loss circuitry components, wherein the high-loss circuitry components are attached to the first PCB; and
   wherein the liquid cooling mechanism is operable to actively cool at least the high-loss circuitry components mounted to the first PCB, wherein the high-loss circuitry components are mounted to an opposite side of the PCB relative to the liquid cooling mechanism,
   wherein the low-loss circuitry components are attached to the second PCB,
   wherein the first PCB is a lower-most PCB and the second PCB is an upper-most PCB, the lower-most PCB disposed below the upper-most PCB, wherein the liquid cooling mechanism is attached to a bottom surface of the lower-most PCB and the high-loss circuitry components are attached to an upper surface of the lower-most PCB,
   wherein the low-loss circuitry components are attached to the upper-most PCB, and
   wherein the power converter further includes magnetic components attached to the upper-most PCB.

2. The power converter of claim 1 further comprising a plurality of connector rods connecting the first PCB to the second PCB.

3. The power converter of claim 2, wherein the connector rods are copper and electrically connect the first PCB to the second PCB.

4. The power converter of claim 1, wherein the magnetic components are attached to an upper surface of the upper-most PCB and the low-loss circuitry components are attached to a lower surface of the upper-most PCB.

5. The power converter of claim 2, wherein the low-loss circuitry components are attached to both the upper and lower surfaces of the upper-most PCB.

6. The power converter of claim 1, further comprising at least one intermediate PCB disposed between upper-most PCB and the lower-most PCB.

7. The power converter of claim 6, wherein the low-loss circuitry components are attached to at least one of an upper or lower surface of the intermediate PCB, and a magnetic component is attached to an upper surface of the upper-most PCB.

8. The power converter of claim 1, wherein the liquid cooling mechanism is a cold plate heatsink having an inlet and an outlet configured to circulate a liquid coolant therethrough and to transfer heat from the high-loss circuitry components to the liquid coolant.

9. A method of cooling a power converter, the method comprising:
   operating a power converter, wherein the power converter includes:
      a plurality of printed circuit boards (PCB) connected via a plurality of connector rods, the plurality of PCBs including a lower-most PCB and an upper-most PCB;
      a liquid cooling mechanism attached to the lower-most PCB;
      high-loss circuitry components attached to the lower-most PCB;
      low-loss circuitry components attached to one of the plurality of printed circuit boards, wherein the high-loss circuitry components have higher losses relative to the low-loss circuitry components;
   actively cooling the high-loss circuitry components via the liquid cooling mechanism; and
   passively cooling the low-loss circuitry components, wherein the power converter further includes magnetic components attached to the upper-most PCB.

10. The method of claim 9, actively cooling the high-loss circuitry components includes circulating a coolant through the liquid cooling mechanism and transferring heat from the high-loss circuitry components to the coolant.

11. The method of claim 9, wherein the power converter further includes a magnetic component disposed on the upper-most PCB.

12. A DC-DC power converter comprising:
   a first printed circuit board (PCB) and a second PCB, with the first PCB and the second PCB attached to one another and extending parallel and spaced apart from one another;
   a liquid cooling mechanism mounted to the first PCB;
   a plurality of circuitry components including high-loss circuitry components and low-loss circuitry components, wherein the high-loss circuitry components have higher losses relative to the low-loss circuitry components, wherein the high-loss circuitry components are attached to the first PCB; and
   a magnetic component attached to an upper surface of the second PCB, wherein the low-loss circuitry components are attached to a lower surface of the second PCB, and
   wherein the liquid cooling mechanism is operable to actively cool at least the high-loss circuitry components mounted to the first PCB, wherein the high-loss circuitry components are mounted to an opposite side of the first PCB relative to the liquid cooling mechanism.

13. The DC-DC power converter of claim 12, further comprising a plurality of connector rods of electrically conductive material connecting the first PCB to the second PCB.

14. The DC-DC power converter of claim 12, wherein the low-loss circuitry components are attached to both the upper and lower surfaces of the second PCB.

* * * * *